(12) United States Patent
Kim et al.

(10) Patent No.: US 7,394,071 B2
(45) Date of Patent: Jul. 1, 2008

(54) MICRO COLUMN ELECTRON BEAM APPARATUS FORMED IN LOW TEMPERATURE CO-FIRED CERAMIC SUBSTRATE

(75) Inventors: Dae Jun Kim, Daejeon (KR); Jin Woo Jeong, Daegu (KR); Sang Kuk Choi, Daejeon (KR); Dae Yong Kim, Daejeon (KR); Ho Seob Kim, Chungcheongnam-do (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 277 days.

(21) Appl. No.: 11/260,025

(22) Filed: Oct. 24, 2005

(65) Prior Publication Data

US 2006/0131752 A1  Jun. 22, 2006

(30) Foreign Application Priority Data

Dec. 20, 2004 (KR) ............... 10-2004-0109003
Jun. 9, 2005 (KR) ............... 10-2005-0049196

(51) Int. Cl.
*H01J 37/304* (2006.01)
(52) U.S. Cl. ............ 250/311; 250/396 R; 250/398
(58) Field of Classification Search ............ 250/396 R, 250/492.2, 492.1
See application file for complete search history.

(56) References Cited

U.S. PATENT DOCUMENTS

| | | | |
|---|---|---|---|
| 4,812,889 A * | 3/1989 | Kakumu | 257/407 |
| 5,637,539 A | 6/1997 | Hofmann et al. | |
| 5,780,375 A * | 7/1998 | Drozdyk | 501/137 |
| 5,834,106 A * | 11/1998 | Kamiaka et al. | 428/304.4 |
| 5,889,445 A * | 3/1999 | Ritter et al. | 333/172 |
| 6,570,320 B1 | 5/2003 | Burkhardt et al. | |
| 7,109,486 B1 * | 9/2006 | Spallas et al. | 250/311 |

FOREIGN PATENT DOCUMENTS

KR  10-2004-0044798  5/2004
KR  1020040044798  5/2004

OTHER PUBLICATIONS

"The Multi-layer Deflector fo rArrayed Microcolumn using LTCC Technology", D. Kim, et al., Microprocesses and Nanotechnology 2004, Oct. 27-29, 4 pages.
The Novel Deflector for Multi Arrayed Microcolumn Using Microelectromechanical System (MEMS) Technology, H. Kim et al, JPN. J. Appl. Phys. vol. 42, Jun. 2003, pp. 4084-4088.

* cited by examiner

*Primary Examiner*—Nikita Wells
*Assistant Examiner*—Johnnie L Smith
(74) *Attorney, Agent, or Firm*—Blakely, Sokoloff, Taylor & Zafman LLP

(57) ABSTRACT

A micro column electron beam apparatus having a reduced number of interconnections is provided. The micro column electron beam apparatus includes: a low temperature co-fired ceramic (LTCC) substrate; a plurality of deflector electrodes attached to a predetermined top portion of the LTCC substrate; a pad electrode placed at a top edge of the LTCC substrate and transmitting an external signal to the deflector electrodes; and a connection unit placed in the LTCC substrate and electrically connecting the deflector electrode and the pad electrode.

10 Claims, 4 Drawing Sheets

MICRO COLUMN ELECTRON BEAM APPARATUS FORMED IN LOW TEMPERATURE CO-FIRED CERAMIC SUBSTRATE

CROSS-REFERENCE TO RELATED PATENT APPLICATIONS

This application claims the benefit of Korean Patent Application Nos. 10-2004-0109003, filed on Dec. 20, 2004 and 10-2005-0049196, filed on Jun. 9, 2005 in the Korean Intellectual Property Office, the disclosures of which incorporated herein in their entirety by reference.

BACKGROUND OF THE INVENTION

1. Field of the Invention

The present invention relates to a micro column electron beam apparatus, and more particularly, to a micro column electron beam apparatus having a reduced number of interconnections.

2. Description of the Related Art

In general, micro column electron beam apparatuses or micro columns are used for radiating electron beams generated by an electron emission source or a cathode source onto a wafer. Specifically, micro columns are used to form a photoresist pattern on a wafer by supplying electron beams thereon.

Micro columns include an electron emission source or a cathode source, a silicon electrostatic lens or a micro lens, and at least one deflector. The deflectors include 8 bar-shaped electrodes arranged like the blades of a propeller. The deflectors are made of silicon by reactive ion etching (RIE). When a plurality of micro columns with high resolution are used in a lithography process, lithography throughput can be remarkably improved.

However, in conventional micro columns, a plurality of interconnections are needed in one micro column. Specifically, an electron beam deflector as one of the elements of a micro column includes 8 unit electrodes. The unit electrodes include 16 electrodes and are attached to upper and lower portions of the substrate. In order to transmit signals to the electrodes, 16 interconnections are required. In addition, in order to focus electron beams irradiated in a radial shape, a lens module including three silicon lenses is needed at the upper and lower portions of the substrate, and the lens module requires at least 6 interconnections. As such, one micro column has at least 22 interconnections.

Furthermore, when micro columns are arranged in parallel so as to improve productivity, for example, when 4 micro columns are arranged in parallel (2×2), 88 (22×4) interconnections are required. Accordingly, when n×m micro columns are arranged in parallel, 22×m×n interconnections are required. Thus, the number of interconnections increases with the number of micro columns. In addition, since the conventional interconnections are arranged above a substrate, an interaction such as a parasitic capacitance may occur between the interconnections.

A pad electrode to which an external signal is applied is located at an edge of the substrate, and the pad electrode is connected to each electrode of a micro column via the interconnections. In this case, as the pad electrode is formed at the edge of the substrate, the lengths of the interconnections between micro columns close to the pad electrode and micro columns far from the pad electrode may be different from each other although the same signal is applied to the interconnections. As such, the interconnections have different resistances, and due to this resistance difference and the parasitic capacitance, an RC signal delay between the interconnections occurs. As a result, due to the RC signal delay, different signals are applied to an electrode of each micro column to which the same signal should be applied. Thus, a micro column electron beam apparatus having a small number of interconnections and a small signal delay is required.

SUMMARY OF THE INVENTION

The present invention provides a micro column electro beam apparatus having a reduced number of interconnections arranged on a substrate.

The present invention also provides a micro column electro beam apparatus that can prevent a signal delay.

According to an aspect of the present invention, there is provided a micro column electron beam apparatus including: a low temperature co-fired ceramic (LTCC) substrate; a plurality of deflector electrodes attached to a predetermined top portion of the LTCC substrate; a pad electrode placed at a top edge of the LTCC substrate and transmitting an external signal to the deflector electrodes; and a connection unit placed in the LTCC substrate and electrically connecting the deflector electrode and the pad electrode.

The connection unit may include: interconnection layers respectively placed between the multilayered ceramic layers; a contact electrode placed between a surface of the ceramic layer and the deflector electrode; and a via contact formed in the ceramic layer and electrically connecting the interconnection layers and the interconnection layer and the contact electrode.

A resistance of an interconnection layer between the pad electrode and the deflector electrode adjacent to the pad electrode and a resistance between the pad electrode and the deflector electrode far from the pad electrode may be substantially equal to each other.

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF THE INVENTION

Figure 1:
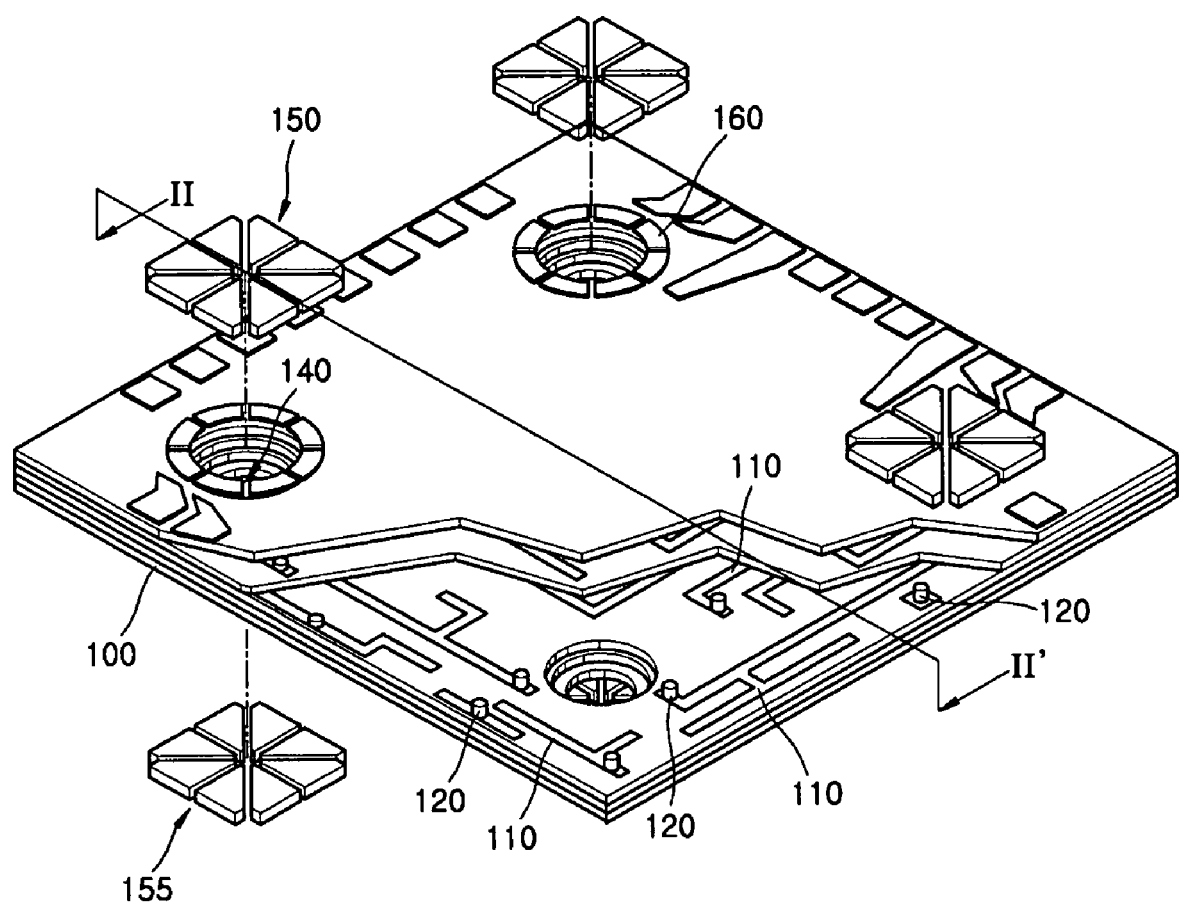
FIG. 1 is an exploded perspective view of a micro column electron beam apparatus formed in a low temperature co-fired ceramic (LTCC) substrate according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements.

Figure 2:
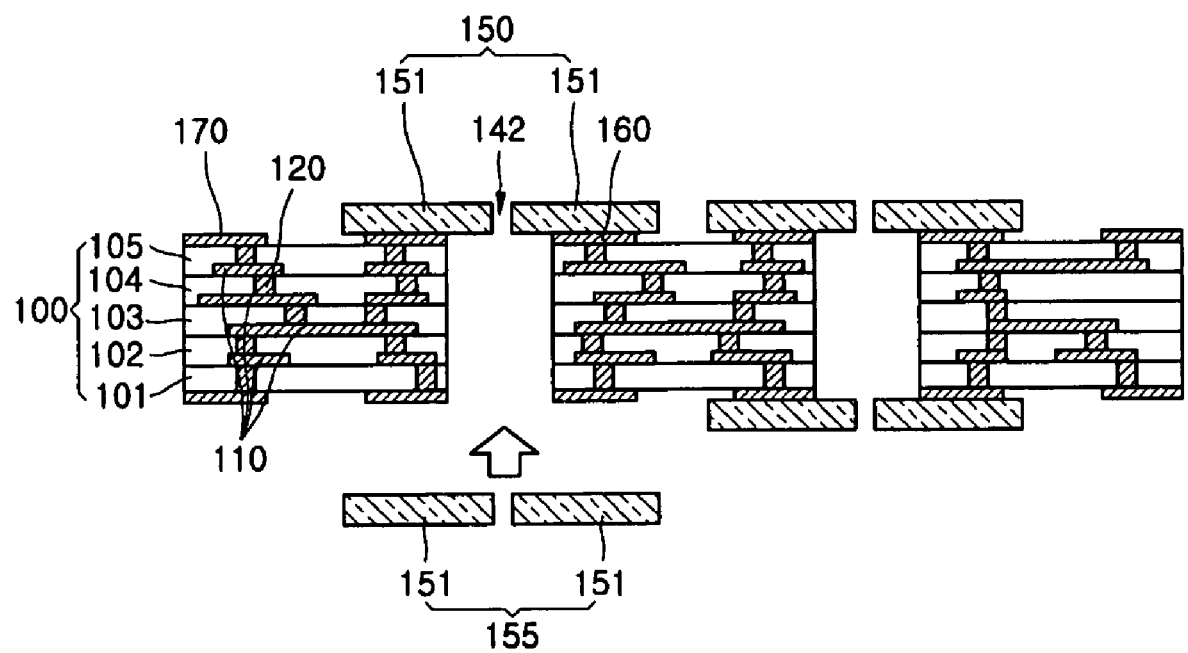
FIG. 2 is a cross-sectional view of an LTCC substrate taken along line II-II' of FIG. 1.

FIG. 1 is an exploded perspective view of a micro column electron beam apparatus according to an embodiment of the present invention, and FIG. 2 is a cross-sectional view of a low temperature co-fired ceramic (LTCC) substrate taken along line II-II' of FIG. 1.

The micro column electron beam apparatus of FIG. 1 includes an LTCC substrate 100. The LTCC substrate 100 is a ceramic substrate obtained by performing one firing process at a low temperature less than 900° C. The LTCC substrate 100 can be applied to a superhigh frequency device that works in a radio frequency or millimeter band, is very small, can be highly integrated since it has a low-loss structure, and can be used even under a superhigh vacuum atmosphere of $10^{-10}$ torr. Referring to FIG. 2, the LTCC substrate 100 includes laminated and multilayered ceramic layers 101, 102, 103, 104, and 105 and interconnection layers 110 respectively interposed between the ceramic layers 101 to 105. Each of the interconnection layers 110 may be formed of Ag, for example, made in a printing manner. In addition, the interconnection layers 110 formed on different layers, that is, the interconnection layers 110 placed at upper and lower portions of the ceramic layers 101 to 105 are electrically connected by via contacts 120 that pass through the ceramic layers 101 to 105. The via contacts 120 may also be formed of Ag having high conductivity.

A plurality of first holes 140 are formed in the LTCC substrate 100. A deflector electrode 150 is to be inserted into the first holes 140. When 2×2 micro column arrays are manufactured, four holes 140 are formed.

Figure 3:
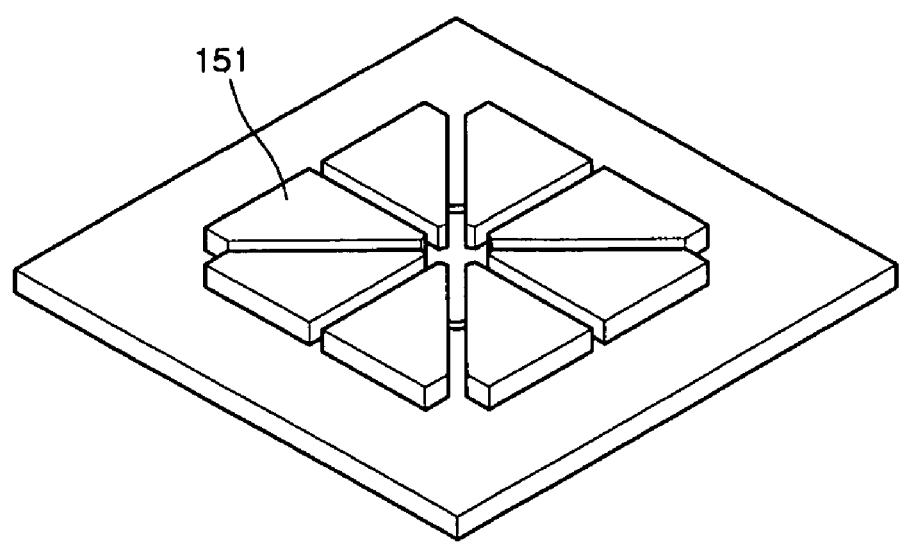
FIG. 3 is a plan view of a deflector of a micro column electron beam apparatus.

A pair of deflector electrodes 150 and 155 are attached to each of upper and lower portions of the first hole 140. The deflector electrodes 150 and 155 include 8 unit electrodes 151, as shown in FIG. 3. The unit electrodes 151 are arranged to be symmetrical with one another along a circumference of the first hole 140 and may be formed of silicon, for example. In addition, when each of the unit electrodes 151 are formed of silicon, impurities may be included in the unit electrodes 151 so that the unit electrodes 151 have a conductivity. The unit electrodes 151 may be formed by silicon wafer reactive ion etching (RIE). The unit electrodes 151 of the deflector electrodes 150 and 155 are attached to cover a part of the first hole 140, and a second hole 142 is defined in the first hole 140. In this case, the size of the second hole 142 may be a size at which electron beams pass through, about 500 μm to 1 mm, for example.

A contact electrode 160 is formed between each of the unit electrodes 151 of the deflector electrodes 150 and 155 and the LTCC substrate 100. The contact electrode 160 may be formed of Ag, for example. In addition, the unit electrode 151 of the deflector electrodes 150 and 155 and the contact electrode 160 may be electrically joined with each other by using a conductive adhesive, for example, conductive epoxy (not shown).

Figure 4:
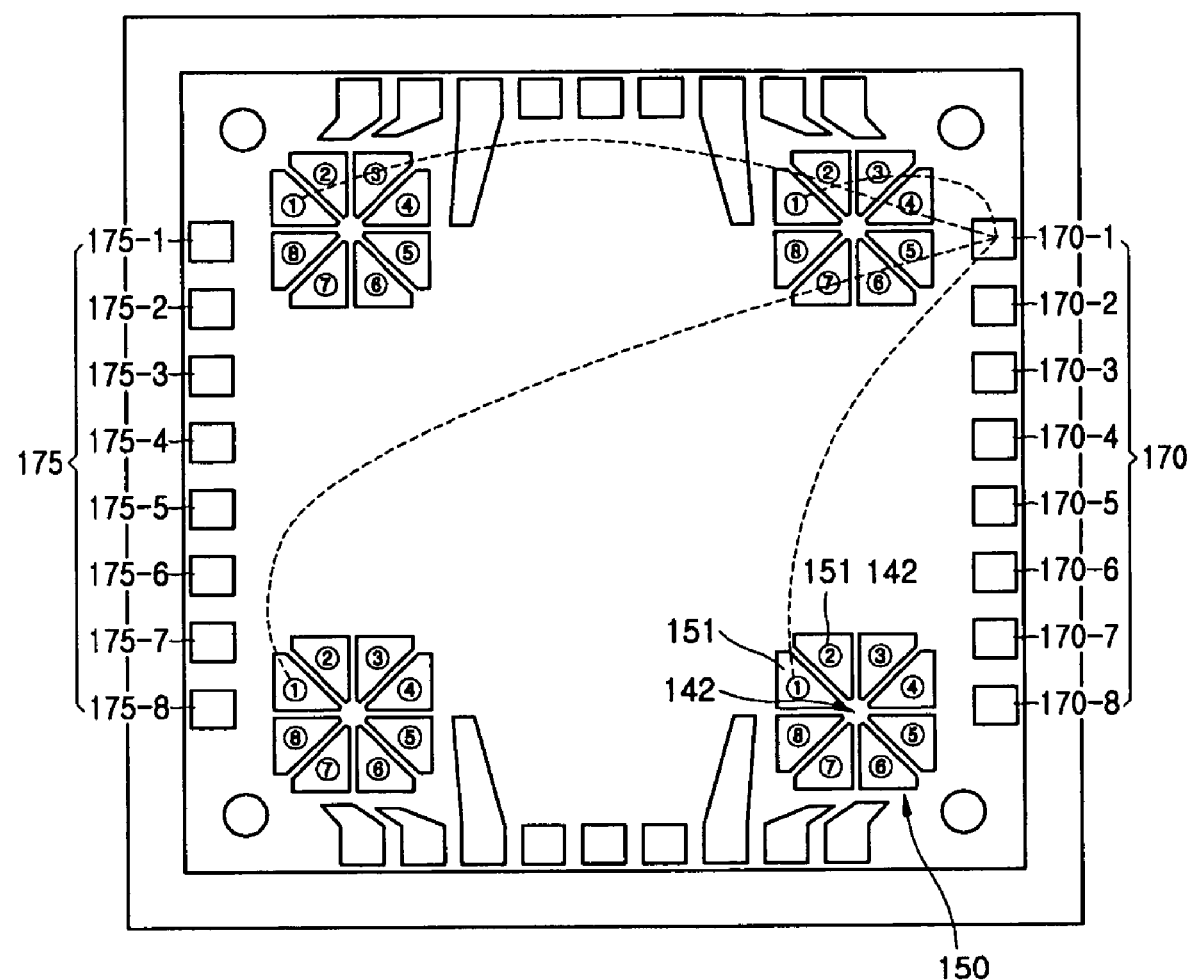
FIG. 4 is a plan view of a top surface of a micro column electron beam apparatus according to an embodiment of the present invention.

Referring to FIG. 4, first and second pad electrodes 170 and 175 are disposed at an edge of the LTCC substrate 100. Each of the first and second pad electrodes 170 and 175 includes 8 unit pads 170-1 to 170-8 so as to transmit signals to each of the unit electrodes 151 of the deflector electrodes 150 and 155. The first and second electrodes 170 and 175 are disposed to face each other. The first pad electrode 170 may transmit a signal to the deflector electrode 150 attached to an upper portion of the LTCC substrate 100, and the second pad electrode 175 may transmit a signal to the deflector electrode 155 attached to a bottom portion of the LTCC substrate 100. The first and second pad electrodes 170 and 175 may be formed of Ag and simultaneously with the contact electrode 160. The first and second pad electrodes 170 and 175 supply signals to the corresponding unit electrode 151 of the deflector electrodes 150 and 155 via the interconnection layers 110 formed in the LTCC substrate 100 and the via contacts 120.

Each of the unit electrodes 151 of a plurality of, for example, 4 deflector electrodes 150 disposed on the LTCC substrate 100 is connected to each of the unit pads 170-1 to 170-8 via the interconnection layers 110 and the via contacts 120. That is, the first pad 170-1 of the first pad electrode 170 is designed to be electrically connected to the first unit pads ① of the deflector electrode 150 placed on the LTCC substrate 100, and the other pads 170-2 to 170-8 are also designed to be electrically connected to the corresponding unit pads. As such, when a signal is applied to the first pad electrode 170, the deflector electrodes 150 placed above the LTCC substrate 100 are synchronized simultaneously. In addition, the second pad electrode 175 and the deflector electrode 155 placed at the rear side of the LTCC substrate 100 are connected in the same way.

In this case, as the pad electrodes 170 and 175 are placed at one edge of the LTCC substrate 100, the deflector electrodes 150 and 155 may be adjacent to each other or spaced by a predetermined gap apart from each other. As such, the lengths of interconnection layers between a pad electrode and a deflector electrode may be different so that an RC signal delay between the deflector electrodes 150 and 155 close to the pad electrodes 170 and 175 and the deflector electrodes 150 and 155 far from the pad electrodes 170 and 175 may occur like in the prior art.

However, in the present embodiment, the cross-section of the interconnection layer 110, and cross-section and thickness (height) of the via contact 120 are adjusted so that the same signal can be simultaneously applied to each of the deflector electrodes 150 and 155 formed on the same surface without a signal delay. In general, the resistance is inverse proportional to cross-sections of interconnections and proportional to lengths thereof. As such, cross-sections, that is, widths of the pad electrodes 170 and 175, and the cross-section, that is, the width of the interconnection layer 110 that connects the deflector electrodes 150 and 155 far from the pad electrodes 170 and 175, are designed to be larger, and the thickness, that is, height of the via contact 120 that connects the interconnections 110 is designed to be smaller and the cross-section, that is, the diameter of the via contact 120, are designed to be larger. On the other hands, cross-sections, that is, widths of the pad electrodes 170 and 175, and the cross-section, that is, the width of the interconnection layer 110 that connects the deflector electrodes 150 and 155 close to the pad electrodes 170 and 175, are designed to be smaller, and the thickness of the via contact 120 that connects the interconnections 110 is designed to be larger and the cross-section of the via contact 120 is designed to be smaller. Then, a resistance between the interconnection layer 110 that connects the adjacent deflector electrodes 150 and 155 and the interconnection layer 110 that connects the distant deflector electrodes 150 and 155 can be uniform. If cross-sections and thicknesses of the interconnection layer 110 and the via contact 120 are adjusted like in the present embodiment, an RC signal delay difference less than about $10^{-12}$ second can be obtained.

Figure 5:
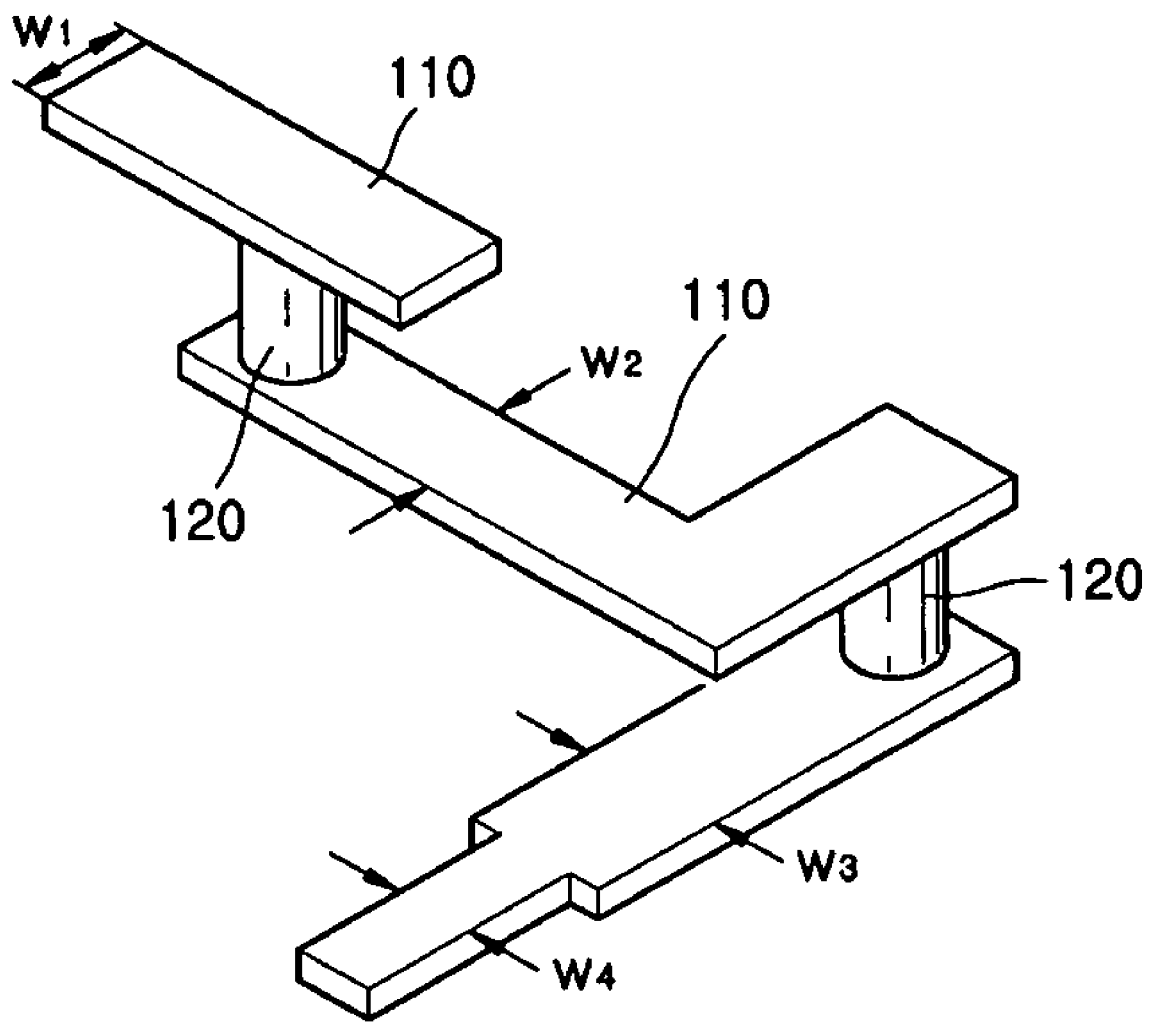
FIG. 5 is a perspective view of an interconnection layer and a via contact of an LTCC substrate according to an embodiment of the present invention.

FIG. 5 is a perspective view of an interconnection layer and a via contact of an LTCC substrate according to an embodiment of the present invention. Referring to FIG. 5, the interconnection layer 110 may be designed to have larger widths $W_1$ and $W_3$ and smaller widths $W_2$ and $W_4$ in consideration of the resistance thereof, and the diameter of the via contact 120 may also be adjusted. In the drawing, the ceramic layers 101 to 105 are omitted so as to show the width of the interconnection layer 110. The resistance of the interconnection layer 110 and capacitance between the interconnection layers 110 can be more precisely calculated by electromagnetic (EM) simulation.

As the micro column electron beam apparatus according to the present invention is formed in the LTCC substrate 100, the interconnection layer 110 can be formed in the LTCC substrate 100. As such, an interconnection is not formed above the LTCC substrate 100 so that a parasitic capacitance between adjacent interconnections can be reduced. As the interconnection layer 110 according to the present invention is disposed based on EM simulation optimized between the ceramic layers 101 to 105, the parasitic capacitance can be more reduced.

In addition, as the interconnection layers 110 in the present embodiment are formed in a multilayered shape to be connected to upper and lower portions of the laminated ceramic layers 101 to 105, the line width of the interconnection layer 110 can be easily adjusted. As such, in addition, the width of the interconnection layer 110 formed in the LTCC substrate 100, the length of the interconnection layer 110, and thickness and caliber of the via contact 120 are adjusted so that a resistance between interconnection layers to which the same signal is applied can be uniform.

The present invention is not limited to the above-described embodiments. In the present embodiments, a monolithic micro column has been described and the present invention can also be applied to combination micro columns. In addition, the arrangement of the deflector electrode and the pad electrode is not limited to the above description.

As described above, the micro column electron beam apparatus according to the present invention is formed in the LTCC substrate in which multilayered interconnection layers are formed. As such, the number of interconnections to be disposed on the LTCC substrate can be reduced.

In addition, the width and length of the interconnection layer in the LTCC substrate and the thickness and diameter of the via contact are adjusted so that a resistance between interconnection layers to which the same signal is applied can be uniform and an RC signal delay can be reduced.

While the present invention has been particularly shown and described with reference to exemplary embodiments thereof, it will be understood by those skilled in the art that various changes in form and details may be made therein without departing from the spirit and scope of the invention as defined by the following claims.

What is claimed is:

1. A micro column electron beam apparatus comprising:
a low temperature co-fired ceramic (LTCC) substrate;
a plurality of deflector electrodes attached to a predetermined top portion of the LTCC substrate;
a pad electrode placed at a top edge of the LTCC substrate and transmitting an external signal to the deflector electrodes; and
a connection unit placed in the LTCC substrate and electrically connecting the deflector electrode and the pad electrode, wherein the connection unit is dimensioned such that a resistance of an interconnection layer of the connection unit between the pad electrode and the deflector electrode adjacent to the pad electrode and a resistance between the pad electrode and the deflector electrode far from the pad electrode are substantially equal to each other.

2. The micro column electron beam apparatus of claim 1, wherein the LTCC substrate includes laminated and multilayered ceramic layers.

3. The micro column electron beam apparatus of claim 2, wherein the interconnection layers are respectively placed between the multilayered ceramic layers and the connection unit comprises:
a contact electrode placed between a surface of the ceramic layer and the deflector electrode; and
a via contact formed in the ceramic layer and electrically connecting the interconnection layers, the deflector electrode and the contact electrode.

4. The micro column electron beam apparatus of claim 3, wherein the interconnection layer, the contact electrode, and the via contact are formed of Ag.

5. The micro column electron beam apparatus of claim 3, wherein a conductive adhesive is interposed between the contact electrode and the deflector electrode.

6. The micro column electron beam apparatus of claim 3, wherein a cross-section of the interconnection layer between the pad electrode and the deflector electrode adjacent to the pad electrode and a cross-section of the interconnection layer between the pad electrode and the deflector electrode far from the pad electrode are different, and
a thickness (height) and a diameter (cross-section) of the via contact connecting the interconnection layer between the pad electrode and the deflector electrode adjacent to the pad electrode are different from a thickness (height) and a diameter (cross-section) of the via contact connecting the interconnection layer between the pad electrode and the deflector electrode far from the pad electrode.

7. The micro column electron beam apparatus of claim 6, wherein the cross-section of the interconnection layer between the pad electrode and the deflector electrode adjacent to the pad electrode is smaller than the cross-section of the interconnection layer between the pad electrode and the deflector electrode far from the pad electrode, and
a thickness (height) of the via contact connecting the interconnection layer between the pad electrode and the deflector electrode adjacent to the pad electrode is smaller than that of the via contact connecting the interconnection layer between the pad electrode and the deflector electrode far from the pad electrode and a diameter (cross-section) of the via contact connecting the interconnection layer between the pad electrode and the deflector electrode adjacent to the pad electrode is larger than that of the via contact connecting the interconnection layer between the pad electrode and the deflector electrode far from the pad electrode.

8. The micro column electron beam apparatus of claim 6, wherein a cross-section of each interconnection layer and a thickness and diameter of each via contact are designed so that an RC signal delay difference of each interconnection layer is less than $10^{-12}$ second.

9. The micro column electron beam apparatus of claim 1, wherein a rear deflector electrode is further attached to a rear side of the LTCC substrate to correspond to the deflector electrode.

10. The micro column electron beam apparatus of claim 1, wherein a first hole is formed in the deflector electrode, and
the deflector electrode is attached to cover a part of an edge of the first hole, and a second hole through which electron beams pass is defined in the first hole.

* * * * *